(12) United States Patent
Oberleitner et al.

(10) Patent No.: US 8,502,251 B2
(45) Date of Patent: Aug. 6, 2013

(54) LED MODULE COMPRISING A DOME-SHAPED COLOR CONVERSION LAYER

(75) Inventors: Wolfgang Oberleitner, Vienna (AT); Krisztian Sasdi, Pornoapati (HU); Erwin Baumgartner, Graz (AT)

(73) Assignees: Ledon Lighting Jennersdorf GmbH, Jennersdorf (AT); Lumitech Produktion und Entwicklung GmbH, Jennersdorf (AT)

( * ) Notice: Subject to any disclaimer, the term of this patent is extended or adjusted under 35 U.S.C. 154(b) by 274 days.

(21) Appl. No.: 12/990,457

(22) PCT Filed: Apr. 29, 2009

(86) PCT No.: PCT/EP2009/003103
§ 371 (c)(1),
(2), (4) Date: Nov. 24, 2010

(87) PCT Pub. No.: WO2009/132833
PCT Pub. Date: Nov. 5, 2009

(65) Prior Publication Data
US 2011/0057226 A1    Mar. 10, 2011

(30) Foreign Application Priority Data
Apr. 30, 2008    (DE) ............... 20 2008 005 987 U (51) Int. Cl.
*H01L 33/00*    (2010.01)
(52) U.S. Cl.
USPC ........................................ 257/98; 257/433

(58) Field of Classification Search
USPC ................................ 257/98, 433, E33.072
See application file for complete search history.

(56) References Cited

U.S. PATENT DOCUMENTS

| | | | |
|---|---|---|---|
| 2002/0031688 A1 * | 3/2002 | Tanabe et al. | 428/917 |
| 2003/0053310 A1 | 3/2003 | Sommers | |
| 2004/0041222 A1 | 3/2004 | Loh | |
| 2006/0199293 A1 | 9/2006 | Peh et al. | |
| 2007/0114558 A1 | 5/2007 | Lam | |

FOREIGN PATENT DOCUMENTS

| | | |
|---|---|---|
| EP | 1786045 A2 | 5/2007 |
| JP | 05291629 A | 1/1993 |
| JP | 07211943 A | 8/1995 |

OTHER PUBLICATIONS

International Search Report for PCT/EP2009/003103 dated Dec. 10, 2009.

* cited by examiner

*Primary Examiner* — Jarrett Stark
*Assistant Examiner* — John M Parker
(74) *Attorney, Agent, or Firm* — Marshall, Gerstein & Borun LLP (57) ABSTRACT

An LED module comprises at least one LED chip emitting monochromatic light having a first spectrum, a platform on which the LED chip is mounted, a reflecting wall that is separate from or integrated into the platform and surrounds the LED chip on all sides, and a dispensed layer applied above the LED chip. The dispensed layer extends in a dome-shaped manner beyond the reflecting wall such that the following equation is satisfied: $0.1*b \leqq h \leqq 0.5*b$ where h is the height of the dome-shaped dispensed layer, measured from the topmost point of the reflecting wall to the apex of the dome, and b is the diameter of the depression formed by the reflecting wall, measured as the distance from the central axis of the wall.

28 Claims, 4 Drawing Sheets

LED MODULE COMPRISING A DOME-SHAPED COLOR CONVERSION LAYER

BACKGROUND OF THE INVENTION

1. Field of the Invention

The present invention relates quite generally to the field of LED modules, i.e. modules in which an LED chip ("LED die") is applied to a mount, generally a platform. It is known in the case of such LED modules, inter alia for mechanically protecting bonding wires, for example, or else for influencing optical properties of the light emitted by the LED chip, to then apply ("dispense") a light-transmissive layer over the LED chip by means of known techniques (for example stenciling technique).

2. Related Technology

There are various technologies for applying the LED chip to the platform. Using the so-called chip-on-board (COB) technique, the light-emitting LED chip is normally placed directly onto a printed circuit board and then encapsulated with the transparent dispensed material. Using surface-mount technology (SMT), the chip is generally surrounded by a reflective material in order to reduce the proportion of light which could otherwise be lost as a result of scattering effects.

The entirety of the material surrounding the LED chip (reflector walls, platform, etc.) will be referred to below as a "package". In addition to improving the efficiency by virtue of pre-aligning the emitted light by means of reflective surfaces (ceramic, metal, etc.), the object of the "package" is to ensure in particular the electrical supply to the LED chip (for example by means of "vias" through the package or bonding wires) and to provide effective heat dissipation from the LED chip to the surrounding environment.

Silicone and epoxy resin, for example, are known as transparent dispensed material. The transparent dispensed material can contain, if appropriate, wavelength-converting substances (referred to below as phosphors), scattering particles for improved mixing of the converted spectrum with the spectrum originally emitted by the LED chip and additives for adapting rheological parameters such as viscosity, storage modulus and loss modulus.

The uncured mixture of the dispensed material with optionally taken phosphors, viscosity additives etc. is also referred to below as "paste".

In the COB sector, high-viscosity pastes are generally used for dispensing, i.e. pastes with a viscosity of more than 50 Pas, and a storage modulus of more than 100 and preferably 500-1000 in order to ensure an approximately hemispherical surface form and mechanical stability and dimensional stability of the dispensed layer.

In the case of very compact packages in which possibly a plurality of cavities for accommodating LED chips are positioned tightly packed next to one another on a silicon wafer, dispensing such high-viscosity pastes can, however, present problems owing to possible air inclusions. The risk of air inclusions can be reduced by lowering the viscosity and also by increasing the shear force during the dispensing process. However, in this case, the risk of the silicone flowing together between two or more adjacent cavities is increased.

It is known from EP1786045A2 to apply a dispensed layer over an LED chip applied in a depression in a platform by means of a dispensing process.

It is known from US 2006/0199293 A1 to dispense an epoxy resin with a viscosity of 2000 to 3000 cP (from 2 to 3 Pas) over an LED chip.

SUMMARY OF THE INVENTION

In accordance with a first aspect, the invention proposes an LED module, having:
  at least one LED chip, which emits monochromatic light in a first spectrum,
  a platform, to which the LED chip is applied,
  a reflective wall, which is designed to be separate from or integrated with the platform and surrounds the LED chip on all sides, and
  a dispensed layer applied over the LED chip.

In this case, the dispensed layer extends in the form of a dome beyond the reflective wall such that the following equation is met:

$$0.1 * b_1 \leq h_1 \leq 0.5 * b_1$$

where:
  $h_1$ is the excess height of the dome-shaped dispensed layer, measured from the uppermost point of the reflective wall to the apex of the dome, and
  $b_1$ is the diameter of the depression formed by the reflective wall, measured as the distance of the mid-axis of the wall.

The dome with a considerable excess height has the following advantages:
  improvement in the light output efficiency
  improvement in the color homogeneity of the light emitted over the different angles
  increase in the packing density on the wafer, on the module or on the printed circuit board
  decrease in the dispensed volume.

The dispensed layer is, for example, a color conversion layer with phosphor particles which convert the first spectrum of the LED chip partially into light from a second spectrum, wherein the LED module emits a mixed light from the first and second spectrum.

The dispensed layer can have scattering particles.

The dispensed layer can have viscosity-increasing substances such as silicic acid, for example.

Preferably, the equation $0.15 * b_1 \leq h_1 \leq 0.3 * b_1$ or $0.2 * b_1 \leq h_1 \leq 0.25 * b_1$ is met.

Preferably, $h_1$ is greater than 200 μm, preferably greater than 250 μm, particularly preferably greater than 300 μm.

The platform can be manufactured on the basis of silicon, for example.

The outer edges of the, for example, square or rectangular LED module can have a length in the range of from 2 mm to 3 mm.

The maximum diameter $b_2$ of the dome can be, for example, at most 10%, preferably 5% smaller than the distance $b_1$ of the mid-axis of the wall.

Preferably, the distance between the light-emitting diode chip and the reflective wall is a maximum of 0.5 mm. Optimally, this distance is in the range between 0.1 mm and 0.2 mm.

The reflective wall can be aligned vertically.

In this case, the reflective wall can form a frame which borders the at least one LED chip.

In accordance with a further aspect, the invention proposes an LED module, having:
  at least one LED chip, which emits monochromatic light in a first spectrum,
  a platform, to which the LED chip is applied,
  a reflective wall, which is designed to be separate from or integrated with the platform and surrounds the LED chip on all sides, and
  a dispensed layer applied over the LED chip.

In this case, the distance between the light-emitting diode chip and the reflective wall is a maximum of 0.5 mm, preferably in the range between 0.1 mm and 0.2 mm.

The dispensed layer is, for example, a color conversion layer with phosphor particles which convert the first spectrum of the LED chip partially into light from a second spectrum, wherein the LED module emits a mixed light from the first and second spectrum.

The dispensed layer can have scattering particles.

The dispensed layer can have viscosity-increasing substances such as silicic acid, for example.

Preferably, the dispensed layer has a flat, concave or convex surface on the side facing away from the platform.

Furthermore, the arrangement comprising the LED chip, the dispensed layer and the reflective wall is surrounded by an optical element which is formed by a lens.

The reflective wall is preferably aligned vertically.

In this case, the reflective wall forms a frame which borders the at least one LED chip.

The invention also relates to an LED module arrangement, having a plurality of LED modules of the abovementioned type connected to a common platform. In this case, the dispensed layers overlap with the reflector walls, wherein mutually adjoining dispensed layers do not merge with one another and are spaced apart from one another on a common reflector wall.

The dispensed layer can be applied, for example, with a viscosity of more than 50 Pas, preferably between 60 and 80 Pas.

The dispensed layer can be applied with a pressure of more than 10 bar, preferably less than from 15 to 20 bar. A higher pressure is advantageous since the flow response is improved temporarily during dispensing as a result of high pressure.

The storage modulus of the dispensed layer during application can be between 500-1000, preferably 500-1000.

BRIEF DESCRIPTION OF THE DRAWINGS

Further advantages, features and properties of the invention will now be explained in more detail with reference to the figures in the attached drawings, in which.

DETAILED DESCRIPTION

Figure 1:
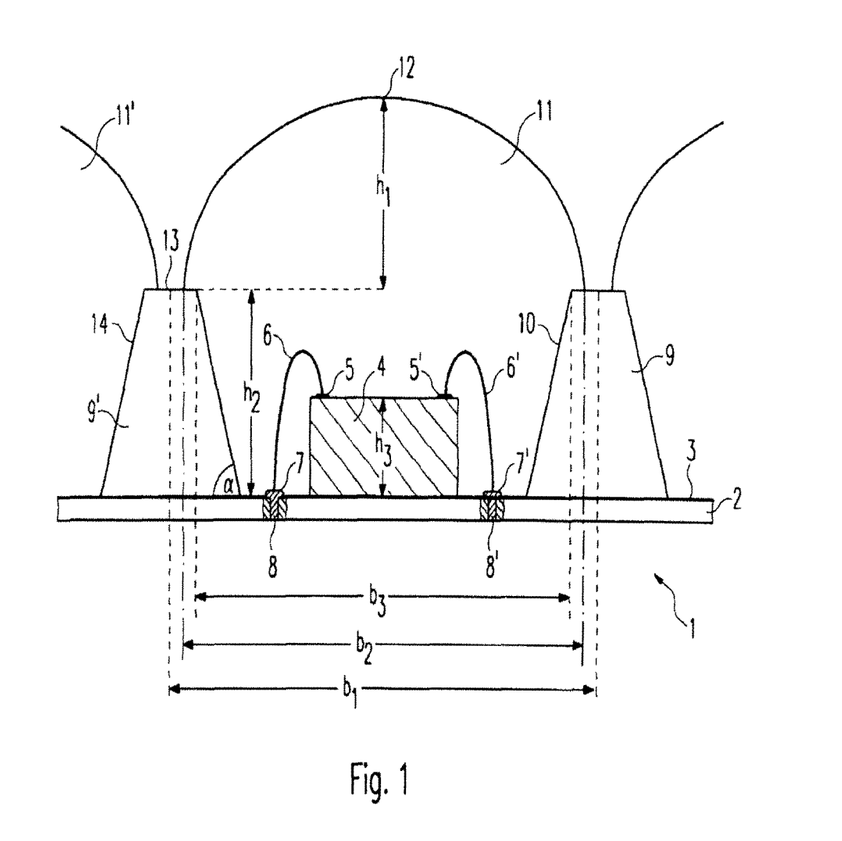
FIG. 1 shows a lateral sectional arrangement of a first exemplary embodiment of an LED module according to the invention.

As can be seen from FIG. 1, an LED module 1 according to the invention has a, for example, wafer-like platform 2, which can be manufactured based on silicon, for example. An LED chip 4 is arranged on the upper side 3 of this platform 2. However, it is also possible to insert a plurality of LED chips into the LED module. The use of OLEDs is also conceivable.

A $SiC_2$ layer can be applied to the upper side of the platform 2.

In the example illustrated, a so-called face-up (FU) configuration is provided, i.e. electrodes 5, 5' on the upper side of the LED chip 4 are connected electrically by means of bonding wires 6, 6' to metal-plating pads 7, 7' on the upper side of the platform 2. Metallic vias 8, 8' consisting of Au, Al or Ag, for example, lead from the metal-plating pads 7, 7' on the rear side of the platform 2 in order thus to connect the electrodes 5, 5' of the LED chip 4 to the rear side of the platform 2.

A reflector wall 9, which can likewise consist of silicon, is provided so as to surround the LED chip 4 laterally at a defined distance. This reflector wall 9 can be designed to be integral with the platform 2 (for example by means of an etching process), or else can be placed onto the platform 2 as a separate component part. In this way, the reflector wall 9 can form a frame which borders the at least one LED chip 4.

Preferably, at least the inner walls 10 of this reflector wall 9 are inclined at an angle $\alpha$. Preferably, these inner sides 10 are also designed to be reflective, for example by means of these faces being polished or else by coating with a metal layer, for example. The reflector wall can have a reflector, for example, which consists of Teflon. The upper side 13 of each reflector wall 9 is preferably flat.

A dispensed layer 11 is applied above the LED chip 4. This dispensed layer 11 fills the space defined by the reflective wall 9, which is located partially to the side of the LED chip 4 and partially above said LED chip. Furthermore, the dispensed layer 11 extends beyond the highest point of the reflector wall 9 by an excess height $h_1$ in the form of a dome, however. This highest point of the reflector wall 9 is arranged in FIG. 1 in such a way that it is above the upper side of the platform 2 at a height $h_2$. To be more precise, the height $h_1$ denotes the excess height of the apex 12 of the dome-shaped dispensed layer above the highest point of the reflector wall 9.

The width of the base of the dome, i.e. the diameter of the dome on the upper side of the reflector wall 9, is denoted by $b_2$ in FIG. 1.

$b_3$ denotes the width (i.e. the diameter for a round shape) of the highest point of the inclined inner sides 10 of the reflector wall 9.

$b_2$ denotes the diameter of the preferably circular reflector wall 9, to be precise measured on the inner side at the central line which divides the upper side 13 of the reflector wall 9 in half. Given the symmetrical configuration of the reflector wall 9 shown in FIG. 1, in which said reflector wall has walls 10 and 14 which are respectively inclined through an angle $\alpha$, the width b1 therefore corresponds to the diameter of the circular reflector wall 9 measured at the vertical axis of symmetry of the reflector wall.

Preferably, the diameter $b_2$, i.e. the diameter of the base of the dome 11, is selected such that it is at most 10%, preferably 5% or even lower below the diameter b1. This means that the domes virtually adjoin one another without merging with one another, in the event of an arrangement of a plurality of LED modules (shown in FIG. 1) which is illustrated in the plan view in FIG. 2.

The dome-shaped dispensed layers overlap with the upper side 13 of the preferably flat reflector wall.

According to the invention, it has now been found that, in the event of an increase in the excess height of the dispensed layer, i.e. in the event of a particularly convex configuration of the dome-shaped dispensed layer, the output efficiency of the light can be increased, with this effect being greater, according to the invention, the higher the wavelength of the light is, i.e., for example, the gain in efficiency of the light exit is greater for red LEDs with a constant surface shape and the same composition of the dispensed layer than for blue or green LEDs, for example, the greater the ratio h1/b1 is, and the fewer phosphors are contained in the dispensed matrix, i.e. the gain in efficiency is greater for transparent, monochromatic LEDs (i.e. without any converting phosphors) than for correspondingly color-converted LEDs given the same chip and the same chip power.

If, for example, the ratio h1/b1 is selected such that the following equation is met:

$$0.15*b1 \leq h1 \leq 0.25*b1,$$

it has been found according to the invention that the gain in efficiency with respect to the light exit is as follows:

red LEDs: 30-40%
blue LEDs: 20-30%
white LEDs: (6500 K) 12-17%.

As a result of a lens effect of the convex dispensed layer, this lens effect being all the greater the more pronounced the curvature, in addition the emission characteristic is changed, i.e. is narrowed considerably as the excess height increases, with this change in turn being greater for monochromatic LEDs than for color-converted LEDs. The reason for this difference is the scattering effects of the phosphors.

According to the invention, a dispensed layer with a high degree of convexity is achieved by virtue of the fact that, firstly, viscosity-increasing substances are admixed to the silicone matrix, for example. These viscosity-increasing substances can be coated or uncoated silicic acid, for example. Secondly, during the dispensing process, very high shear forces are produced using dispensing needles and a high dispensing pressure, as a result of which it is possible for the otherwise high-viscosity paste to flow for a short period of time.

The invention has now found that the high degree of convexity also has a positive effect on the color homogeneity of the light in the case of white light LEDs. In this context, homogeneity is understood to mean the extent to which the color temperature changes over the different emission angles when observed in a polar diagram. According to the invention, the path of the light through the very convex layer at the edge of the dispensed layer is substantially equal to the path in the center of the dispensed layer.

It should be noted that the reflector wall 9 does not need to be round or elliptical in plan view, but can also be square or rectangular.

In the following table, standard values for the production and design of LED modules are compared with exemplary values in accordance with the invention:

| Parameter | Prior art | Exemplary embodiment |
|---|---|---|
| b1 | 2.50 | 2.50 mm |
| h1 | 100-200 | >200 μm |
| Viscosity | 10-30 | 60-80 Pas |
| Storage modulus | 30-100 | 500-1200 |
| Dispensing pressure | 4 | 30 bar |

Figure 2:
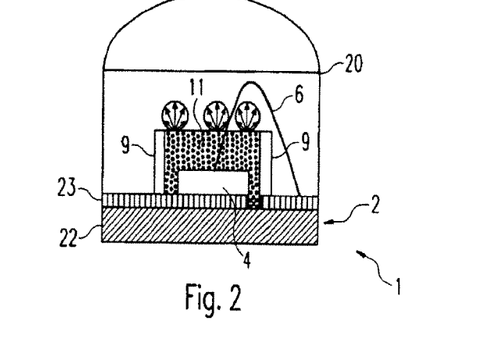
FIG. 2 shows a second embodiment of an LED module according to the invention.

The LED module illustrated in FIG. 2 and provided with the reference symbol 1 shows a further exemplary embodiment of the LED module according to the invention. The substantial difference here consists firstly in that the dispensed layer 11, i.e. the color conversion material, can have a flat surface. That is to say that a lens 20 is positioned on the reflector wall 20 as an additional optical element.

In this case, the LED module first in turn has at least one light-emitting diode chip 4, which preferably emits blue light and which is arranged on a platform 2, i.e. a base, which has an insulating layer 22 and an electrically conductive layer with conductor tracks 23, with bonding wires 6 for making contact with the light-emitting diode chip 4 passing from said conductor tracks to the upper side of said light-emitting diode chip. It should be noted that the base 2 could also be configured differently. In particular, special measures could be taken which make it possible for heat to be dissipated effectively from the light-emitting diode chip 4.

In order to convert the light emitted by the light-emitting diode chip 4 into white mixed light, a color conversion material 11 is provided which surrounds the light-emitting diode chip 4 and has color conversion particles, in particular phosphors, which convert at least some of the light into a light of a different wavelength. According to the invention, the light-emitting diode chip 4 and the color conversion material 11 are surrounded by a reflective wall 9, which can be formed, for example, by a metallic reflector or else can also be configured so as to be diffusely reflective and, for this purpose consists of Teflon or barium sulfate, for example. In contrast to known light-emitting diode arrangements, the reflective wall 9 is provided around the light-emitting diode chip 4 already at a distance of less than 0.5 mm; optimally this distance is approximately 0.1 mm to 0.2 mm from the side faces of the light-emitting diode chip 4.

In this way, the wall 9 again forms a frame bordering the LED chip. It is now conceivable for such a frame also to have a second region. This could be used as particular protection for the bonding wire 6. This means that the region of the conductor track 23 with which electrical contact is made with the bonding wire is bordered by the second frame region and is therefore protected thereby. For this purpose, it is furthermore advantageous if the second frame region is filled with a medium, for example with silicone, once contact has been made between the bonding wire and the conductor track during manufacture of the LED module.

By virtue of the preferably vertically aligned, reflective wall 9, light emitted laterally from the light-emitting diode chip 4 is deflected again, and therefore initially the size of the light-emitting area is restricted to the upper opening of the reflector 9. In addition, light which exits laterally from the light-emitting diode chip 4 is partially converted in the surrounding color conversion material 11 or that portion which has not been absorbed and converted when passing through the phosphor particles for the first time is reflected on the reflective wall 9 and then passed back again until this light also has a white spectral distribution and exits on the upper side of the color conversion material 11.

The arrangement comprising the LED chip 4, the color conversion material 11 and the reflector 9 is finally also surrounded by an optical element, which is formed by a lens 20 surrounding the arrangement. The lens 20 is configured such that it has a curved surface only in its upper region in order to image the light exiting on the upper side of the color conversion material 11 in a desired manner. The lower, cylindrical region of the lens, on the other hand, does not have any optical function since, owing to the light-emitting region being limited with the aid of the reflector 9, no light exits in any case in these regions. The reflector 9 therefore makes it possible to use a lens with a very simple and compact configuration which, in spite of everything, completely images the light emitted by the light-emitting diode chip and possibly converted by the color conversion material 11. Laterally exiting light, on the other hand, which has an undesired color mix and therefore could not be used is not present in the LED module according to the invention.

Figure 3A:
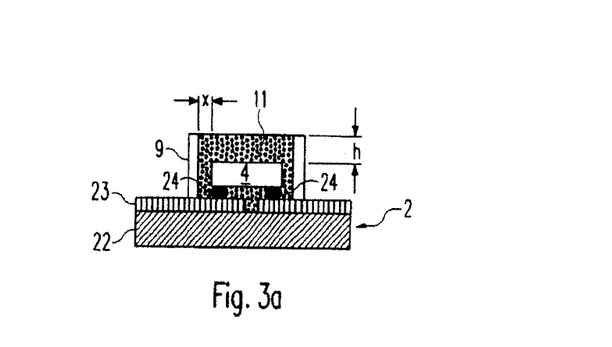
FIGS. 3a-3c show a schematic for illustrating the geometric dimensions of the color conversion material used for the color conversion in three different embodiments.

The particular dimensions of the LED module 1 according to the invention are illustrated once again in FIG. 3a, which shows part of a third exemplary embodiment of the LED module according to the invention. As can be seen from this illustration, the distance between the side face of the light-emitting diode chip 4 and the reflector 9 is denoted by x, whereas the distance between the surface of the light-emitting diode chip 4 and the surface of the color conversion material 11 is denoted by h. As has already been mentioned, the distance x between the light-emitting diode chip and the reflector 9 is selected according to the invention to be very small and is at most 0.5 mm, preferably only 0.1 mm to 0.2 mm. The height h of the color conversion layer 7, on the other hand, is at least 0.05 mm and is preferably selected such that hmin=0.05 mm+x holds true for the minimum height. In principle, there is no upper limit for the height h of the color conversion layer since the generation of the mixed light is optimized the greater the height is. As has already been mentioned at the outset, the probability for the conversion of the light emitted by the light-emitting diode chip 4 is proportional to the path length of the light through the color conversion material 11, for which reason a thickness which is as great as possible is desirable for achieving a homogeneous light emission. For manufacturing reasons, however, an upper limit for the thickness h of 3 mm is preferably selected since, when viewed as a whole, a configuration of the LED module which is as compact and flat as possible is also desired.

The arrangement in FIG. 3a differs from the second exemplary embodiment of an LED module illustrated in FIG. 2 in that now electrical contact is no longer made with the light-emitting diode chip 4 via bonding wires. Instead, the chip 4 is "face down" in the embodiment illustrated, i.e. is arranged in opposite fashion. The contact is made in such a case by means of so-called bumps 24, which produce direct contact of the layer with the conductor tracks 23 with respect to the surface of the chip 4. This arrangement of the light-emitting diode chip 4 on the base 2, which arrangement is often also referred to as flip-chip technology, also entails advantages, inter alia, as regards the light intensity which can be achieved since it is possible to achieve improved light emission with this mounting technique. This can be attributed, inter alia, to the fact that no bonding wires are required and therefore a shadow-free emission area is produced.

Instead of using conductor tracks, however, it is also conceivable to implement a via. For this purpose, the bumps 24 can be connected electrically to metallic vias, for example consisting of Au, Al or Ag. Said vias serve the purpose of connecting the electrodes of the LED chip 4 to the rear side of the platform 2.

Figure 4:
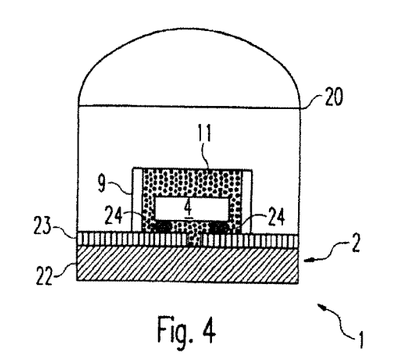
FIG. 4 shows a third exemplary embodiment of an LED module according to the invention.

A complete arrangement of a light-emitting diode arrangement in which the reflector 9 with the color conversion material 11 and the light-emitting diode chip 4 is in turn surrounded by a lens arrangement 20 is illustrated in FIG. 4.

Figure 3B:
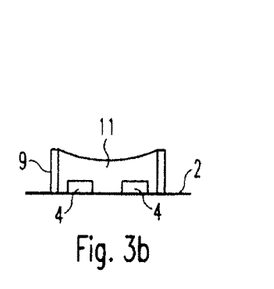
Figure 3C:
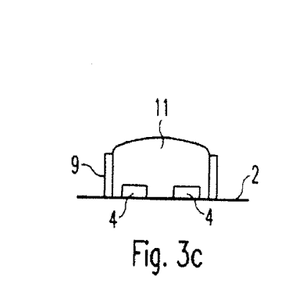

FIGS. 3b and 3c show further exemplary embodiments of the color conversion material 11, which is surrounded by the reflective wall 9. Said color conversion material can also have a concave surface, as is shown in FIG. 3b. A convex surface is also conceivable, as shown in FIG. 3c. Furthermore, the LED module in this case has in each case two LED chips 4. However, it is also possible for more or fewer LED chips to be used.

Figure 5A:
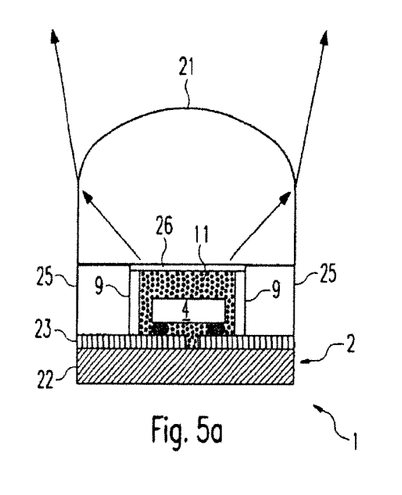
FIGS. 5a and 5b show a fourth exemplary embodiment of an LED module according to the invention.
Figure 5B:
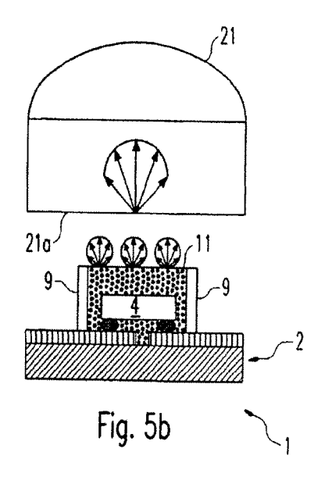

In the abovementioned exemplary embodiment according to the invention shown in FIG. 2, the color conversion material 11 and the reflector 9 have been enclosed directly by the optical element forming the lens 20. FIGS. 5a and 5b now show a further exemplary embodiment of an LED module 1 according to the invention, in which a so-called auxiliary lens 21 is used which is arranged at a distance from the surface of the color conversion material 11. The LED module 1 initially again has the same elements as the exemplary embodiment shown in FIG. 4, with identical components having been provided with the same reference symbols. In addition, however, spacers 25 are now arranged on the surface of the electrically conductive layer with the conductor tracks 23, with the auxiliary lens 21 being arranged on the upper side of said spacers. The height of the spacers 25, which can be formed by a further insulating layer, for example, is selected such that the auxiliary lens 21 is separated from the color conversion material 11 via a small air gap 26. This enable particularly efficient imaging of the light exiting from the upper side of the color conversion material 11.

That is to say that the light which exits through the surface of the color conversion material 11 is now coupled into the auxiliary lens 21 via the air gap 26. As it exits from the color conversion material 11, the light undergoes Lambertian distribution owing to the control by the phosphor material and the refractive index transition from the phosphor matrix material to air, i.e. the light emission is substantially equal when viewed in all directions. In turn, this distribution is focused onto a region of, for example, ±41.8° as the light enters the auxiliary lens 21, corresponding to the refractive index of the lens for the case in which the refractive index of the auxiliary lens 21 is n=1.5. This effect is illustrated in FIG. 5b. As they exit the lens 11, the light beams need to then be deflected by a maximum of 21.8° for a 40° lens, for example, which can be implemented without a great deal of complexity and in particular without any considerable losses.

The illustrated design with the color conversion material delimited laterally by a reflector therefore provides the possibility of imaging light to virtually 100%, with the exception of Fresnel reflections. In comparison with the prior art, the useful light portion can therefore be substantially increased within a desired target range. At the same time, more effective color mixing is achieved, which ensures that white mixed light can be imaged homogeneously effectively even by means of a lens or another type of conventional optical element.

Figure 6:
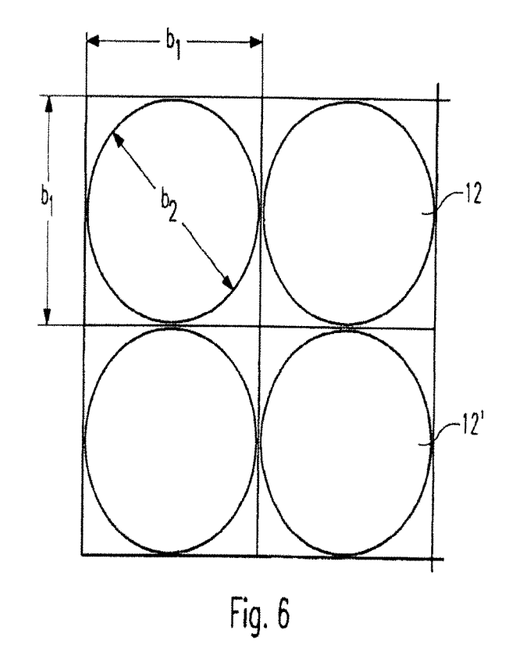
FIG. 6 shows a plan view of an arrangement according to the invention of LED modules.

As can be seen from FIG. 6, in accordance with the invention, LED modules for forming an LED module arrangement can be arranged next to one another in a row or matrix, i.e. in one or two dimensions. This LED module arrangement has a common platform 2. Mutually adjoining dispensed layers (12, 12') can overlap a common reflector wall without the two merging with one another. As can be seen from FIG. 1, there is a distance a between two mutually adjacent dome-shaped dispensed layers, which distance is smaller than the width 13 of the reflector wall which is flat at the top. If an additional optical element is used, as has been shown in FIG. 2, each individual LED module is preferably covered by such an optical element. However, it is also conceivable for a plurality of LED modules to be covered by a common optical element. If this optical element acts as diffuser, the emitted light from these LED modules can thus be mixed.

The invention relates in particular to COB and SMT modules with LED chips. In the case of said modules, the following advantages result, in particular for the exemplary embodiment shown in FIG. 1:

As a result of the high viscosity and the high storage modulus during the dispensing operation, an increased convex curvature of the surface of the silicone encapsulation can be achieved (increase in the ratio h1/b1). Firstly, this improves the output efficiency of the light since total reflection effects and optical waveguide effects are reduced. Secondly, given a predetermined height of the dispensed layer (h1, see FIG. 1), the dispensed volume can be reduced and the packing density increased (since the silicone does not run, or only runs to a small extent, between the dispensing and curing process).

In the case of COB, the chip density on the printed circuit board can be increased.

In the case of SMT, for example in the case of silicon platforms, the individual cavities are tightly packed on a Si wafer, on which there are up to several thousand cavities, in the case of 8-inch wafers. Given a corresponding rheology of the dispensing paste, firstly the height $h_1$ can be increased, given a constant packing density, and secondly the packing density can be increased, given a predetermined $h_1$.

There are also advantages in terms of the color homogeneity. Normally, in the case of a low convex silicone encapsulation in COB or in SMT, the average path length of a photon from the LED chip to the silicone surface along the optical axis is shorter than in other locations, with the average path length being longer the further away from the optical axis. By increasing the ratio $h_1/b_1$ (see FIG. 1), the maximum difference between the average path lengths is reduced, i.e. in the case of color-converted white light LEDs, the color impression of the surface becomes more homogeneous when an LED is energized.

| List of reference symbols: | |
| --- | --- |
| 1 | LED module |
| 2 | Platform/base |
| 3 | Upper side of platform |
| 4 | LED chip |
| 5 | Electrodes |
| 6 | Bonding wire |
| 7 | Metal-plating pad |
| 8 | Via |
| 9 | Reflector wall |
| 10 | Inner sides of reflector wall |
| 11 | Dispensed layer/color conversion medium |
| 12 | Apex of dome-shaped dispensed layer |
| 13 | Upper side of reflector wall |
| 14 | Wall |
| 20 | Lens |
| 21 | Auxiliary lens |
| 22 | Insulating layer |
| 23 | Conductor tracks |
| 24 | Bumps |
| 25 | Spacer |
| 26 | Air gap |

The invention claimed is:

1. An LED module, having:
   at least one LED chip, which emits monochromatic light in a first spectrum,
   a platform, to which the LED chip is applied,
   a reflective wall, which is separate from or integrated with the platform and surrounds the LED chip on all sides of the LED chip, and
   a dispensed layer applied over the LED chip,
   wherein the dispensed layer extends in the form of a dome beyond the reflective wall such that the following equation is satisfied:

$$0.1*b_1 \leq h_1 \leq 0.5*b_1$$

where:
   $h_1$ is an excess height by which the dispensed layer extends over a highest point of the reflective wall, and
   $b_1$ is a diameter of a depression formed by the reflective wall, measured as a maximum distance between mid-axes of upper sides of the reflective wall, wherein each mid-axis divides the respective upper side of the reflective wall in half.

2. The LED module as claimed in claim 1, wherein the dispensed layer is a color conversion layer with phosphor particles that convert the first spectrum of the LED chip partially into light from a second spectrum, and wherein the LED module emits a mixed light from the first and second spectra.

3. The LED module as claimed in claim 1, wherein the dispensed layer comprises scattering particles.

4. The LED module as claimed in claim 1, wherein the dispensed layer comprises a viscosity-increasing substance.

5. The LED module as claimed in claim 4, wherein the viscosity-increasing substance is silicic acid.

6. The LED module as claimed in claim 1, wherein the equation $0.15*b_1 \leq h_1 \leq 0.3*b_1$ is satisfied.

7. The LED module as claimed in claim 1, wherein $h_1$ is greater than 200 μm, and an edge length of the depression is 2 mm to 3 mm.

8. The LED module as claimed in claim 7, wherein $h_1$ is greater than 250 μm.

9. The LED module as claimed in claim 7, wherein $h_1$ is greater than 300 μm.

10. The LED module as claimed in claim 1, wherein the platform comprises silicon.

11. The LED module as claimed in claim 1, wherein outer edges of the LED module have a length in a range of from 2 mm to 3 mm.

12. The LED module as claimed in claim 1, wherein a distance between the light-emitting diode chip and the reflective wall is a maximum of 0.5 mm.

13. The LED module as claimed in claim 12, wherein the distance between the light-emitting diode chip and the reflective wall is in the range between 0.1 mm and 0.2 mm.

14. The LED module as claimed in claim 1, wherein the reflective wall is aligned vertically with respect to the platform.

15. The LED module as claimed in claim 1, wherein the reflective wall forms a frame that borders the at least one LED chip.

16. An LED-module, comprising:
   at least one LED chip, which emits monochromatic light in a first spectrum,
   a platform, to which the LED chip is applied,
   a reflective wall, which is separate from or integrated with the platform and surrounds the LED chip on all sides, and
   a dispensed layer applied over the LED chip, wherein a distance between the light-emitting diode chip and the reflective wall is a maximum of 0.5 mm,
   wherein a height of the dispensed layer is in a range of 0.05 mm to 3 mm and the applied dispensed layer comprises a color conversion layer with phosphor particles that convert the first spectrum of the LED chip partially into light from a second spectrum, and wherein the LED module emits a mixed light from the first and second spectra.

17. The LED module as claimed in claim 16, wherein the dispensed layer comprises scattering particles.

18. The LED module as claimed in claim 16, wherein the dispensed layer comprises a viscosity-increasing substance.

19. The LED module as claimed in claim 18, wherein the viscosity-increasing substance is silicic acid.

20. The LED module as claimed in claim 16, wherein the dispensed layer comprises a flat, concave, or convex surface on a side facing away from the platform.

21. The LED module as claimed in claim 16, wherein an arrangement comprising the LED chip, the dispensed layer, and the reflective wall is surrounded by an optical element formed by a lens.

22. The LED module as claimed in claim 16, wherein the reflective wall is aligned vertically with respect to the platform.

23. The LED module as claimed in claim 16, wherein the reflective wall forms a frame that borders the at least one LED chip.

24. An LED-module as claimed in claim 16, wherein a distance between the light-emitting diode chip and the reflective wall is in the range between 0.1 mm and 0.2 mm.

25. An LED module arrangement, comprising a plurality of LED modules as claimed in claim 1 connected to a common platform, wherein mutually adjoining dispensed layers do not merge with one another and are spaced apart from one another by a common reflector wall.

26. The LED module arrangement as claimed in claim 25, wherein the dispensed layers overlap with the reflector walls and are spaced apart from one another on a common reflector wall.

27. An LED module arrangement, comprising a plurality of LED modules as claimed in claim 16 connected to a common platform, wherein mutually adjoining dispensed layers do not merge with one another and are spaced apart from one another by a common reflector wall.

28. The LED module arrangement as claimed in claim 27, wherein the dispensed layers overlap with the reflector walls and are spaced apart from one another on a common reflector wall.

* * * * *